United States Patent
Ajmera et al.

(10) Patent No.: US 7,115,467 B2
(45) Date of Patent: Oct. 3, 2006

(54) METAL INSULATOR METAL (MIM) CAPACITOR FABRICATION WITH SIDEWALL BARRIER REMOVAL ASPECT

(75) Inventors: Sameer Kumar Ajmera, Richardson, TX (US); Darius L. Crenshaw, Allen, TX (US); Stephan Grunow, Dallas, TX (US); Satyavolu S. Papa Rao, Garland, TX (US); Phillip D. Matz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/903,712

(22) Filed: Jul. 30, 2004

(65) Prior Publication Data

US 2006/0024902 A1 Feb. 2, 2006

(51) Int. Cl.
*H01L 21/8242* (2006.01)
(52) U.S. Cl. ...................... 438/253; 438/396
(58) Field of Classification Search ........ 438/238–241, 438/250–256, 391, 393–399
See application file for complete search history.

(56) References Cited

U.S. PATENT DOCUMENTS

| | | | |
|---|---|---|---|
| 6,066,537 A | 5/2000 | Poh | |
| 6,528,366 B1 * | 3/2003 | Tu et al. | 438/253 |
| 6,569,746 B1 * | 5/2003 | Lee et al. | 438/398 |
| 6,635,916 B1 | 10/2003 | Aton | |
| 2002/0096778 A1 * | 7/2002 | Cox | 257/774 |
| 2002/0130388 A1 * | 9/2002 | Stamper | 257/532 |
| 2003/0027385 A1 * | 2/2003 | Park et al. | 438/253 |

\* cited by examiner

*Primary Examiner*—H. Jey Tsai
(74) *Attorney, Agent, or Firm*—Peter K. McLarty; W. James Brady, III; Frederick J. Telecky, Jr.

(57) ABSTRACT

A method (10) of forming a MIM (metal insulator metal) capacitor is disclosed whereby adverse affects associated with copper diffusion are mitigated even as the capacitor is scaled down. A layer of bottom electrode/copper diffusion barrier material (136) is formed (16) within an aperture (128) wherein the capacitor (100) is to be defined. The bottom electrode layer (136) is formed via a directional process so that a horizontal aspect (138) of the layer (136) is formed over a metal (110) at a bottom of the aperture (128) to a thickness (142) that is greater than a thickness (144) of a sidewall aspect (148) of the layer (136) formed upon sidewalls (132) of the aperture (128). Accordingly, the thinner sidewall aspects (148) are removed during an etching act (18) while some of the thicker horizontal aspect (138) remains. A layer of capacitor dielectric material (150) is then conformally formed (20) into the aperture 128 and over the horizontal aspect (138). A layer of top electrode material (152) is then conformally formed (22) over the layer of capacitor dielectric material (150) to complete the capacitor stack (154).

20 Claims, 10 Drawing Sheets

METAL INSULATOR METAL (MIM) CAPACITOR FABRICATION WITH SIDEWALL BARRIER REMOVAL ASPECT

FIELD OF INVENTION

The present invention relates generally to semiconductor devices, and more particularly to a technique for fabricating a MIM capacitor in a manner that removes sidewall portions of a barrier layer.

BACKGROUND OF THE INVENTION

In the manufacture of semiconductor products such as integrated circuits, individual electrical devices are formed on or in a semiconductor substrate, and are thereafter interconnected to form circuits. Interconnection of these devices is typically accomplished by forming a multi-level interconnect network in and through one or more dielectric or non-conductive layers that are formed over the electrical devices to electrically isolate the devices from one another. A conductive material, such as copper, is deposited into vias and/or trenches formed within these dielectric layers to connect the devices and thereby establish the multi-level interconnect network.

MIM (metal insulator metal) capacitors are semiconductor devices that are formed by sandwiching a thin layer or film of dielectric material between two layers of conductive material, usually metals. The metal layers can be said to comprise some or all of top and bottom electrodes, respectively, of the capacitor. Generally the bottom and/or top electrodes are in contact with a conductive copper via or trench, which can also be said to comprise some of the respective electrode of the capacitor. At times, however, the copper can diffuse from one electrode through the dielectric layer to the other electrode and "short out" or provide a conductive pathway between the two metal layers. This can substantially compromise the capacitor's ability to perform its intended function of storing charge. This deleterious effect may be enhanced through normal operation of the capacitor as the electric field induced during operation can enhance the undesired transport of copper from one electrode to the other. It is therefore necessary to ensure that the MIM capacitor is designed in such a manner that the functionality of the capacitor is maintained for the required lifetime of the device and that the diffusion and/or transport of copper through the dielectric layer is sufficiently controlled or eliminated to ensure such required lifetime.

It can be appreciated that several trends presently exist in the electronics industry. Devices are continually getting smaller, faster and require less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source and also require an ever increasing computational speed and storage capacity to store and process data, such as digital audio, digital video, contact information, database data and the like.

Accordingly, there is a continuing trend in the semiconductor industry to manufacture integrated circuits (ICs) with higher densities. To achieve high densities, there has been and continues to be efforts toward scaling down dimensions (e.g., at submicron levels) on semiconductor wafers. In order to accomplish such high densities, smaller feature sizes, smaller separations between features and layers, and/or more precise feature shapes are required. The scaling-down of integrated circuit dimensions can facilitate faster circuit performance and/or switching speeds, and can lead to higher effective yield in IC fabrication by providing more circuits on a semiconductor die and/or more die per semiconductor wafer, for example.

As device sizes continue to shrink, however, the close proximity of certain areas can lead to undesirable results. With regard to MIM capacitors, for example, bringing the metal layers closer together by reducing the thickness of the thin dielectric film can allow diffused copper to more readily short out the capacitor thereby compromising the capacitor's reliability and useful life. Still, a thin dielectric layer remains desirable as the capacitance, or ability of a capacitor to store charge, changes as a function of the distance between the metal plates, among other things. In particular, the capacitance goes up as the plates are brought closer together, but decreases as the plates are moved further apart. Accordingly, it would be desirable to fabricate a MIM capacitor in a manner that mitigates adverse effects associated with copper diffusion while concurrently allowing the size of the device to be reduced.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a MIM (metal insulator metal) capacitor in a manner that facilitates device scaling while mitigating adverse effects associated with copper diffusion. In particular, sidewall aspects of a layer of material that retards copper diffusion and forms at least some of a bottom electrode of the MIM capacitor are removed during the fabrication process. As such, a secondary conductive path that can "short-out" the sidewall aspects of the top and bottom electrode of the capacitor is removed. The layer of dielectric or insulating material under the top electrode layer can thus be made thinner without the risk of sidewall shorting or copper diffusion compromising the operation of the capacitor. Additionally, since only sidewall aspects of the bottom electrode are removed, a bottom portion of the bottom electrode remains intact and underlying metals are protected thereby.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 7b is an enlargement of an interface area of the MIM capacitor depicted in FIG. 7a.

DETAILED DESCRIPTION OF THE INVENTION

Figure 1:
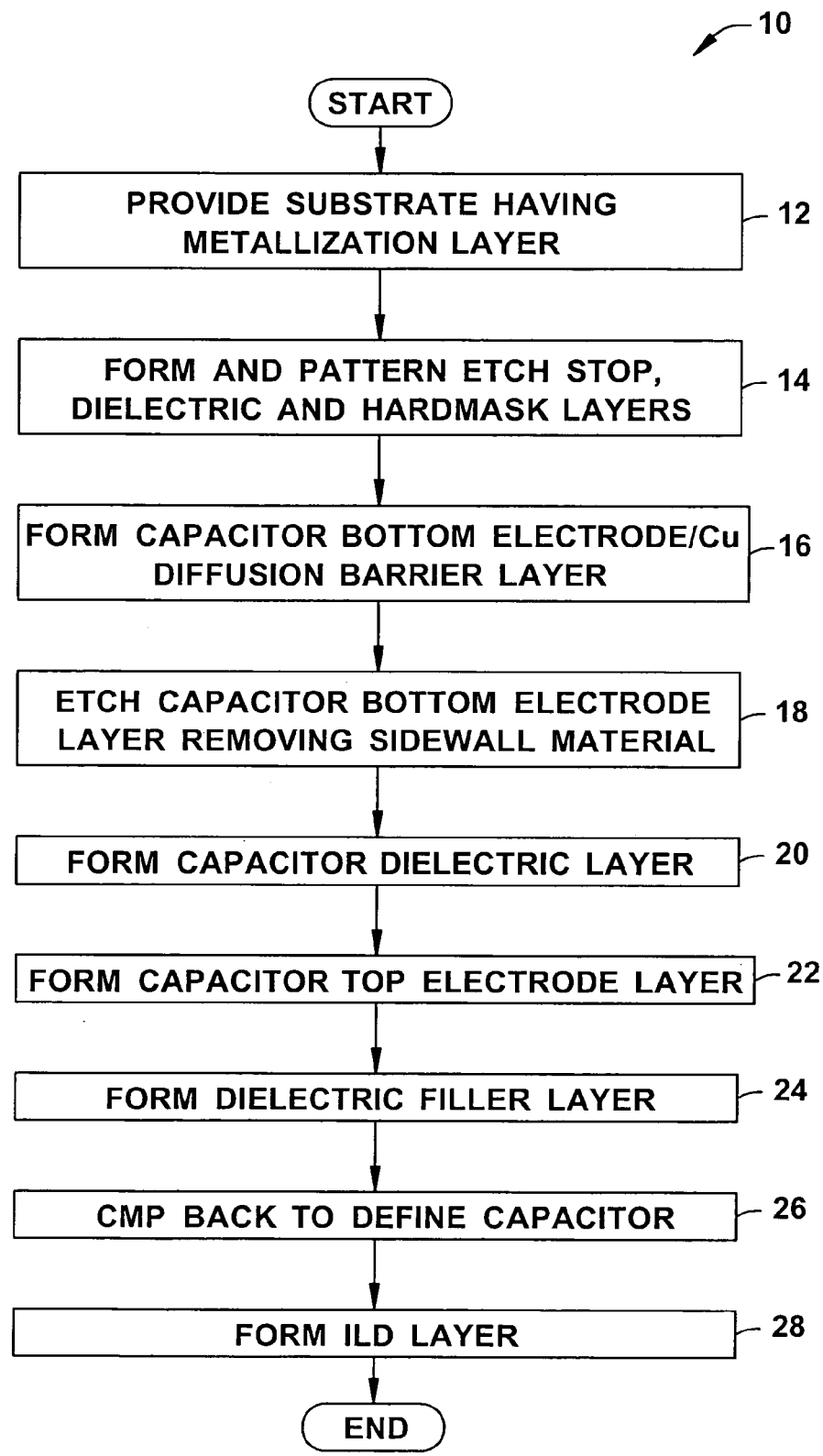
FIG. 1 is a flow diagram illustrating an exemplary methodology for forming a MIM (metal insulator metal) capacitor in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention relates to forming a MIM (metal insulator metal) capacitor in a manner that facilitates device scaling while mitigating adverse effects associated with copper diffusion. In particular, sidewall aspects of a layer of material that acts as a copper diffusion barrier and forms at least some of a bottom electrode of the MIM capacitor are removed during the fabrication process. As such, a secondary conductive path that can "short-out" the sidewall aspects of the top and bottom electrode of the capacitor is removed. A layer of dielectric or insulating material under the top electrode layer can thus be made thinner without the risk of sidewall shorting or copper diffusion. Additionally, since only sidewall aspects of the bottom electrode are removed, the lower portion of the bottom electrode remains intact and underlying metals are protected thereby.

Turning to FIG. 1, an exemplary methodology 10 is illustrated for forming a MIM (metal insulator metal) capacitor according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a MIM capacitor as illustrated and described below with respect to FIGS. 2–7, as well as to devices not shown or described herein.

The methodology 10 begins at 12 wherein a semiconductor substrate is provided or obtained that has been processed through formation of a metallization layer. It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, SiGe, GaAs, InP and/or SOI. In addition, the substrate can include various device elements formed therein such as transistors, for example, and/or layers thereon. These can include metal layers, barrier layers, dielectric layers, device structures, including silicon gates, word lines, source regions, drain regions, bit lines, bases, emitters, collectors, conductive lines, conductive vias, etc. After obtaining the substrate, the methodology advances to 14 wherein layers of an etch stop material, a dielectric material and hardmask material are sequentially formed over the substrate and then patterned (e.g., via etching and/or lithographic techniques). It will be appreciated, however, that the hardmask layer is optional, and may or may not need to be included depending on specifics of the fabrication capabilities used to manufacture the MIM capacitor. For example, the layer of hardmask material may be omitted if an etch chemistry is sufficiently selective (e.g., so that a resist utilized to effect a pattern transfer is not consumed before the pattern is transferred to underlying layers). Accordingly, while one or more hardmask layers may be referred to and illustrated in examples presented herein, such layers may not be necessary to implement one or more aspects of the present invention.

Figure 2:
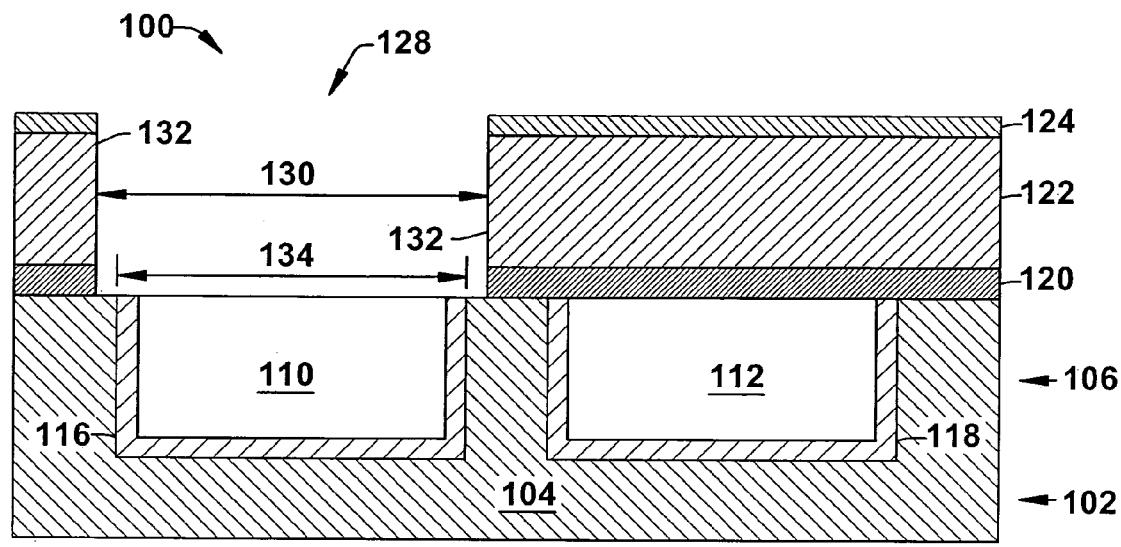
FIGS. 2–7 are cross-sectional illustrations of a MIM capacitor formed according to one or more aspects of the present invention, such as that set forth in FIG. 1.
Figure 3:
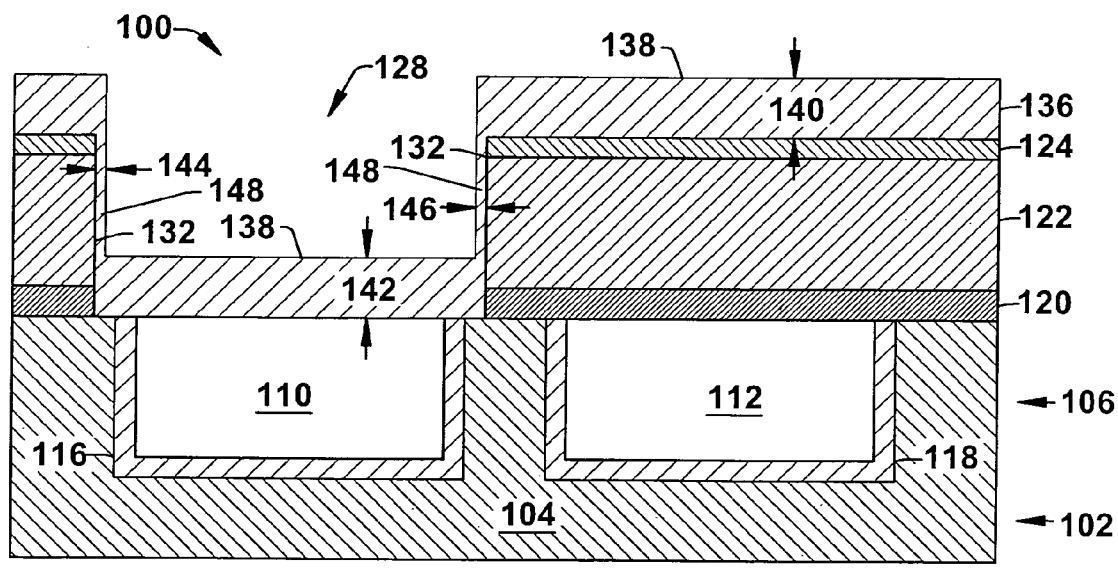

FIG. 2 is a cross-sectional illustration of a MIM capacitor 100 processed through this stage of fabrication. The substrate 102 includes, but is not limited to, an interlayer or interlevel dielectric 104 and a metallization layer 106. The metallization layer 106 includes dielectric material and one or more metals, two in the illustrated example 110, 112. The metals form conductive lines and facilitate electrical contact with surrounding structures through vias and/or trenches formed within dielectric layers. In the illustrated example, the metals are surrounded by respective diffusion barriers 116, 118. The metals 110, 112 generally include copper while the diffusion barriers 116, 118 may include tantalum, or a variety of other barriers, for example. It is to be appreciated that the substrate 102 can include one or more metallization layers that are not illustrated in addition to other non-illustrated device elements. Further, the metallization layer 106 may comprise one or more layers of metallization as may be desired.

A layer of an etch stop material 120 is formed over the substrate 102, dielectric 104 of metallization layer 106 and the metals 110, 112, with a layer of a dielectric material 122 formed over the etch stop layer 120 and a layer of a hardmask material 124 formed over the dielectric layer 122. Layer 120 may also provide electrical isolation and/or mechanical protection for underlying layers and/or structures. It may also provide chemical and/or ion protection, among other things, for example. Additionally, layer 120 may also include one or more layers that may comprise silicon nitride, silicon carbide, silicon oxynitride, silicon oxide, silicon dioxide, silicon carbonitride, organic polymers such as polyimide and/or other materials, for example. By way of example only and not limitation, layer 120 can be formed to a thickness of between about 30 to about 80 nanometers.

Similarly, layer 124 may also provide electrical isolation and/or mechanical protection, and/or chemical and/or ion protection, among other things, for example. Layer 124 may include one or more layers. It is to be appreciated that layer 124 is optional and can be chosen to be included or to be left out by one skilled in the art. Layer 122 may include an oxide based material formed to between about 50 to about 500 nanometers, for example, whereas layer 124 may include silicon oxynitride and/or silicon carbide, silicon nitride, or silicon oxide, for example. Layer 124 can be formed to between about 20 to about 200 nanometers, for example. Further, the layer of dielectric material 122 may include low dielectric constant (low-k) materials, which may or may not be porous. Examples of low-k materials include spin-on-glasses (SOGs), as well as organic, inorganic, and/or quasi-organic materials such as silsesquioxanes, fluorinated silica glasses (FSGs) and fluorinated polyarylene ethers. Other low-k insulator materials include organo-silicate-glasses (OSGs), for example, having dielectric constants (k) as low as about 2.6–3.1, and ultra low-k dielectrics having dielectric constants below 2.6. OSG materials, for example, may be low-density silicate glasses to which alkyl groups have been added to achieve a low-k dielectric characteristic. It may be desirable to utilize low-k materials between conductive (metal) layers since the low-k materials may reduce capacitive coupling between the layers and reduce RC delay times and thereby increase circuit speed. Of course any suitable dielectric material can be utilized for dielectric layer 122, including, but not limited to, oxide based materials, nitride based materials, carbide based materials, silicon based materials, oxynitride based materials, silicon oxide based materials, spin-on dielectrics, organic materials, and quasi-organic materials.

The layer of etch stop material 120, layer of dielectric or capacitor ILD material 122 and layer of hardmask material 124 are patterned so that an aperture 128 is formed therein over metal 110 and diffusion barrier 116. It will be appreciated that the aperture 128 can be formed so that a width 130 between sidewalls 132 of the aperture 128 is slightly larger than a width 134 of the metal 110 and diffusion barrier 116. Additionally, although not shown herein, it will be appreciated that the layer of hardmask material 124 may be consumed during the etching process (e.g., after a resist containing the pattern to be transferred is itself consumed). As such, although the hardmask layer 124 is depicted in the examples presented herein, such a layer may not exist as a result of patterning/etching (or by design as discussed above). Accordingly, layers said to be formed over the hardmask layer 124, such as a bottom electrode layer as discussed below, would instead be formed over the layer of dielectric material 122, for example.

As with all layers described herein (unless specifically indicated to the contrary), layers 120, 122, 124 can be patterned in any suitable manner, such as with etching and/or lithographic techniques. Although not shown, lithography refers to processes for pattern transfer between various media. A radiation sensitive resist coating is formed over one or more layers to which the pattern is to be transferred. The resist is itself first patterned by exposing it to radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist can then serve as a mask for the underlying layers which can be selectively etched to transfer the pattern thereto.

Next, at 16 in FIG. 1, a layer of bottom electrode/copper diffusion barrier material is formed. It can be seen in FIG. 3 that this layer 136 is formed over the layer of hardmask material 124 and down into the aperture 128 onto the metal 110, barrier 116 and sidewalls 132 of the aperture 128. More importantly, the bottom electrode layer 136 is formed so that respective thicknesses 140, 142 of horizontal aspects 138 of this layer 136 on the layer of hardmask material 124 (or on layer 122 if layer 124 is not present) and the metal 110 are substantially greater than thicknesses 144, 146 of sidewall aspects 148 of the material 136 formed on the sidewalls 132 defining the aperture 128. As such, layer 136 is preferably formed by an anisotropic or directional process to establish the different thicknesses 140, 142 and 144, 146.

The layer of bottom electrode/copper diffusion barrier material 136 may, for example, be formed via physical vapor deposition (PVD) whereby the material is deposited in a substantially vertical direction so that there is little accumulation on the sidewalls 132 (as compared to the accumulation on horizontal surfaces). Since this bottom electrode layer 136 is conductive and is in contact with metal 110 which generally contains copper (and which can also be thought of as comprising part of the bottom electrode), layer 136 has to serve as a copper diffusion barrier. Accordingly, layer 136 may contain tantalum and/or tantalum nitride, tantalum silicon nitride, tungsten, tungsten nitride, tungsten silicon nitride, tungsten carbonitride, titanium, titanium nitride or silicided titanium nitride, for example, and may be formed so that thicknesses 140, 142 are between about 8 to about 60 nanometers, for example. By contrast, the anisotropic deposition of layer 136 preferably maintains the thicknesses 144, 146 of the sidewall aspects of layer 136 to less than about 4 nanometers, for example.

Figure 4:
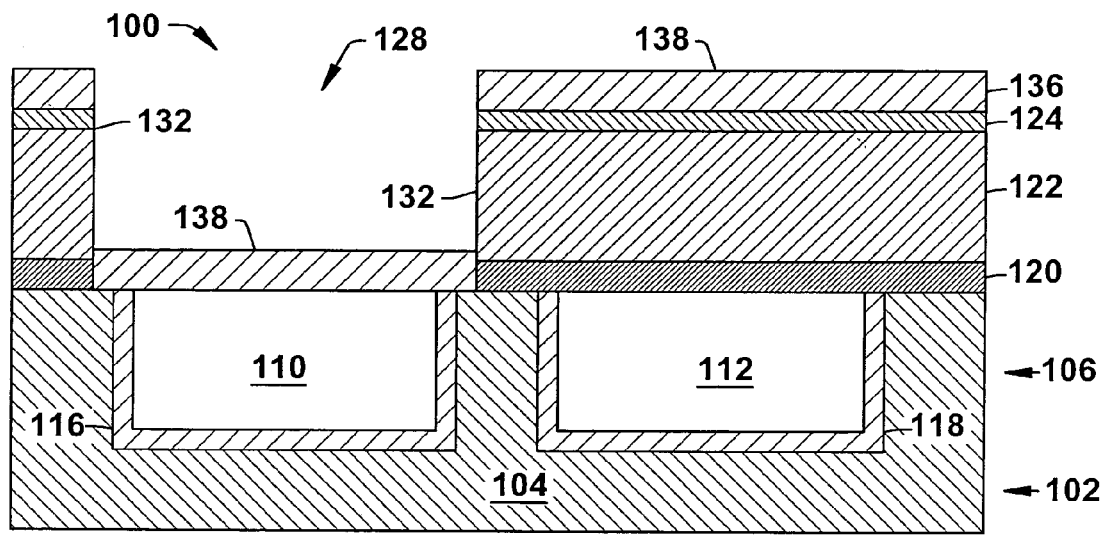

At 18 in FIG. 1, the layer of bottom electrode/copper diffusion barrier material is etched to remove its sidewall aspects. FIG. 4 illustrates that layer 136 is etched so that substantially all of the material 136 is removed from the sidewalls 132 of the aperture 128 while a substantial portion of material 136 remains on the horizontal surfaces of the metal 110 and layer of hardmask material 124 (or on layer 122 if layer 124 is not present, e.g., due to etching or by design). Accordingly, given the differences in thicknesses 140, 142 and 144, 146, the etching is preferably performed in a substantially isotropic manner so that the sidewalls are cleared well before the horizontal surfaces. It will be appreciated that wet and/or dry etching processes can be utilized to remove the layer of material 136 depending on the integration scheme and chemistry preferred, and that the remaining material 136 can have a thickness of greater than about 4 nanometers, for example.

Figure 5:
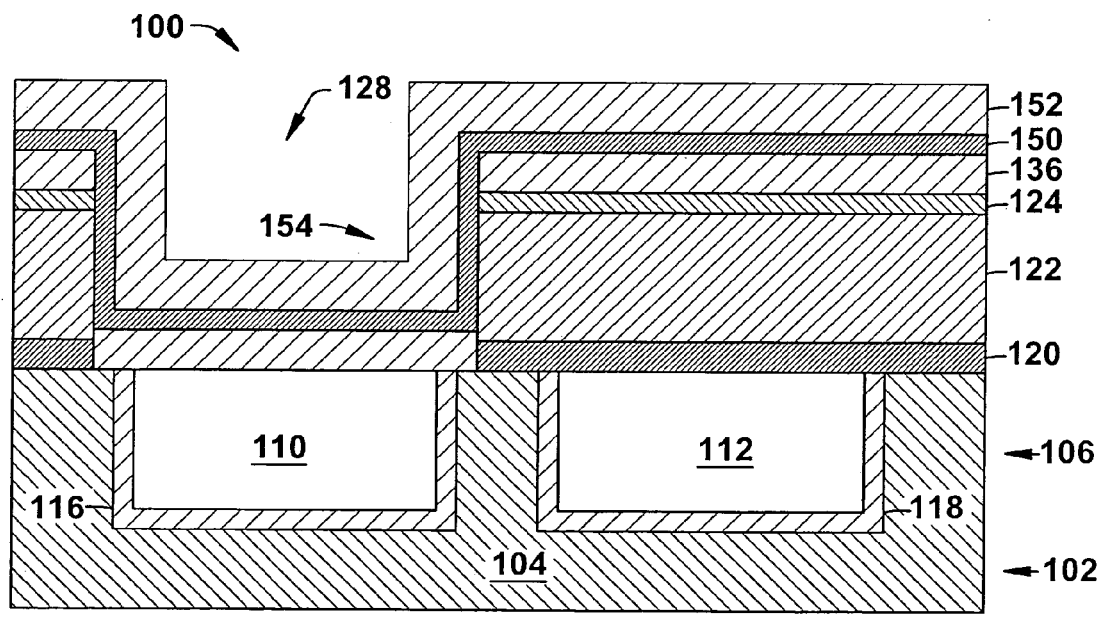

Returning to FIG. 1, the methodology 10 then advances to 20 and 22 wherein a layer of capacitor dielectric material and a layer of capacitor top electrode material are formed, respectively. FIG. 5 illustrates the application of these layers 150, 152, respectively, over layer 136 and down into aperture 128 to complete the capacitor stack 154. As with all layers described herein (unless stated to the contrary), these layers are substantially conformally formed. It will be appreciated that the capacitor dielectric layer 150 can be formed of any one or more suitable materials, such as silicon nitride based materials and/or those set forth above with regard to the layers of dielectric materials 122, 120 and 124. It will also be appreciated that it may be desirable at times to form different dielectric layers from the same or similar materials so that the layers have similar reactions to subsequent treatments (e.g., etching, CMP). At other times, however, it may be desirable to form different layers from different materials so that they respond differently to subsequent treatments (e.g., have different etch rates).

Layer 150 may be formed in any suitable manner, such as via low temperature (e.g., less than about 400 degrees Celsius) plasma enhanced chemical vapor deposition (PECVD), for example, but is generally formed to a thickness of less than about 70 nanometers, for example. The layer of top electrode material 152 can likewise be formed in any suitable manner (e.g., CVD) from any suitable materials (e.g., Ta, TaN) to a thickness of between about 5 to about 50 nanometers, for example. Layer 152 is conductive and also serves as a barrier to limit copper diffusion. Additional functions of layer 152 include mitigating capacitor punchthrough during subsequent etches. Capacitor punchthrough refers to a failure mode caused by a subsequent etch in or near aperture 128 during a downstream fabrication process that etches through layer 152 and also etches into or completely through layers 150 and 136. The punched-through aperture could become filled with a conductive material during processing and thereby short out the capacitor. Layer 152 can act as an etch stop for subsequent etches preventing further etching into layer 150 and below. Additional functions of layer 152 can include providing low electrical resistance between other metallization layers and/or surrounding metals that fill vias, as well as providing good adhesion between such metals.

Figure 6:
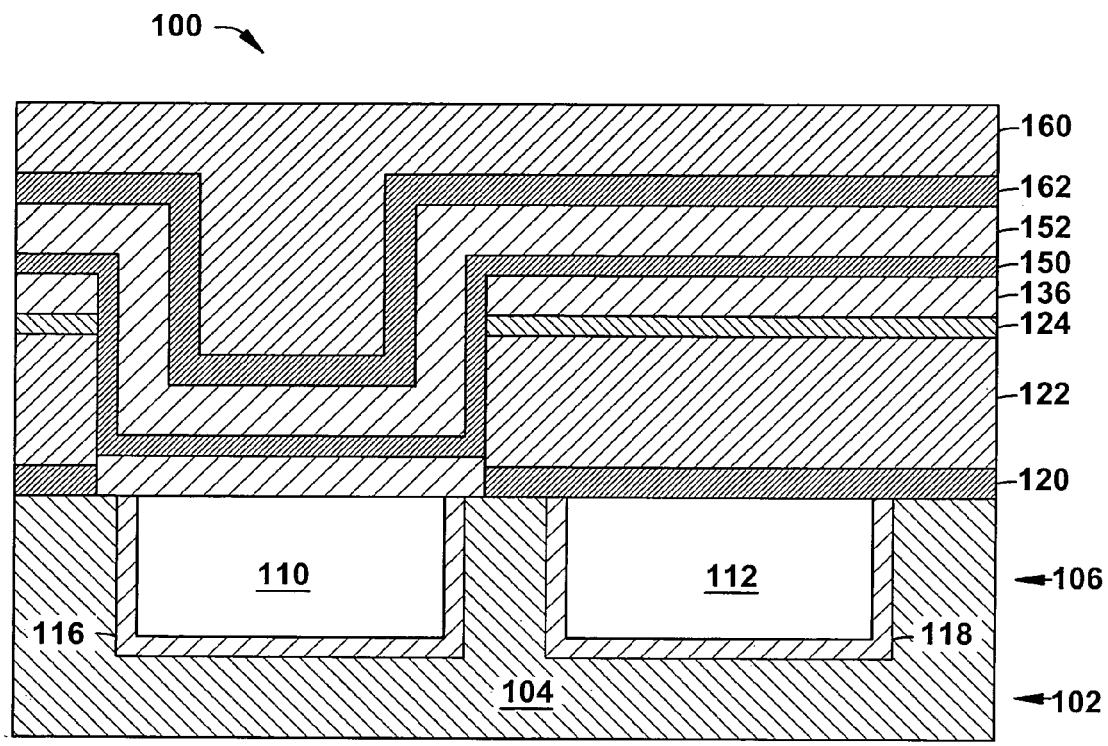

The methodology 10 then proceeds to 24 wherein a layer of dielectric filler material 160 is formed over the top electrode layer 152 and down into the aperture 128. Although not presented in the methodology 10, it can be seen that a layer of etch stop material 162 can be conformally formed over the layer of top electrode material 136 and then the filler material 160 can be formed over the etch stop layer 162 so that it substantially fills the aperture 128 (FIG. 6). Such as layer of etch stop material 162 can be formed from any one or more suitable materials, such as those utilized for etch stop layer 120. The layer of dielectric filler material 160 can likewise be formed of any one or more suitable materials, such as nitride based materials and/or those set forth above with regard to the layer of capacitor ILD material 122. Similarly, the layer of dielectric filler material 160 can be formed in any suitable manner (e.g., CVD) to any suitable thickness required to fill the aperture, for example. The etch stop layers 162, 120 facilitate, among other things, forming vias and conductive contacts to first and second metals 110, 112, respectively, during subsequent processing due to their selectivity to different etching chemistries, for example.

Figure 7:
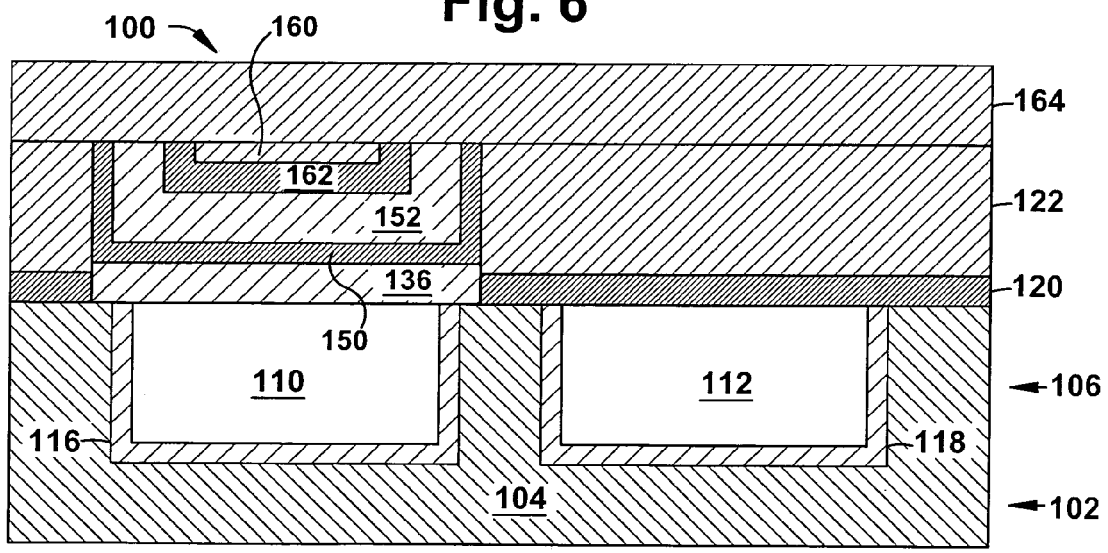

The methodology 10 then advances to 26 wherein a chemical mechanical polishing (CMP) process is performed to define the capacitor. Essentially, excess material of layers 160, 162, 152, 150, 136, and 124 are removed or "polished back" into the layer of dielectric or capacitor ILD material 122, where some of layer 122 may be removed as well (FIG. 7). At 26, an additional layer of ILD material 164 is formed over the capacitor 100 and the remaining capacitor ILD material 122 to form a total ILD thickness (FIG. 7). The layer of ILD material 164 can, accordingly, be formed from the same material as layer 122 and can be formed to a thickness of generally less than about 2000 nanometers, for example. The methodology 10 can then continue for further back-end processing. It can be seen that the capacitor 100 formed in accordance with one or more aspects of the present invention is slightly "u" shaped (FIG. 7).

Figure 7A:
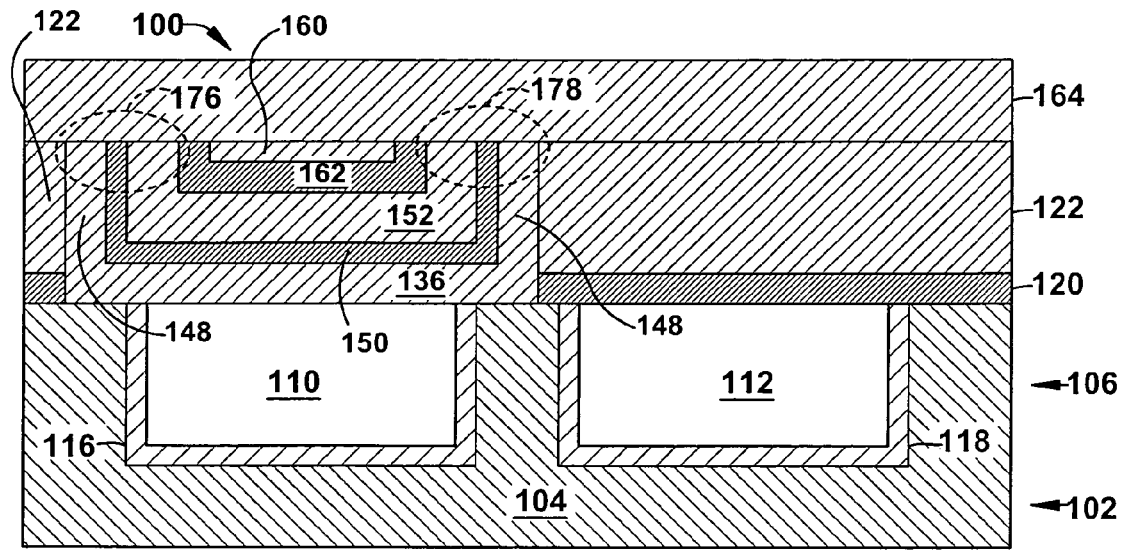
FIG. 7a is a cross-sectional illustration of a MIM capacitor formed without a sidewall removal aspect as disclosed herein.

Turning to FIG. 7a, a MIM capacitor is illustrated that is not formed in accordance with one or more aspects of the present invention. Accordingly, sidewall aspects 148 of the layer bottom electrode/copper diffusion barrier material 136 remain within the "u" shaped capacitor. It will be appreciated that these sidewall aspects 148 are illustrated as being somewhat wider/thicker than those depicted in FIG. 3 since the bottom electrode layer 136 in FIG. 7a (and 7b) would be formed via a more conformal process. Further, horizontal aspects of the layer of capacitor dielectric material 150 (e.g., situated on the horizontal surface of the bottom electrode/copper diffusion barrier material 136) may be thicker than vertical aspects of this layer 150 (e.g., due to step coverage limitations of the deposition process). Accordingly, shorting pathways may be more likely to develop through the sidewall aspects of the dielectric layer 150 since a thinner or less restrictive barrier exists at these locations. Such pathways are all but eliminated by removing the sidewall aspects 148 of the bottom electrode layer 136 in accordance with one or more aspects of the present invention (FIG. 7). Essentially, a second conductive plate necessary for a leakage current path to exist is removed, and thus no path for leakage current to travel through remains.

Figure 7B:
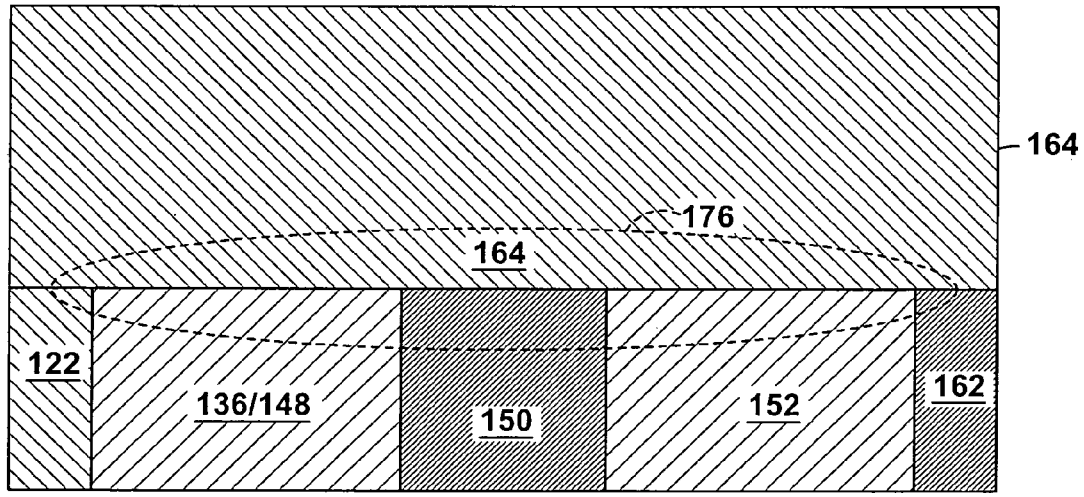

More substantially, as illustrated in FIGS. 7a and 7b, interfaces 176, 178 are defined between layers 122, 136, 150, 152, 162 and 160 (on the bottom of the interfaces) and 164 (on the top of the interfaces). While "shorting" can occur anywhere along the capacitor, such interfaces are more susceptible to current leakage and diffusion of mobile species such as copper. If the sidewall aspects 148 of the bottom electrode layer 136 are not removed, charge and/or mobile species would have an easier path along the interfaces to short out the capacitor 100. For example, since different materials/substances are brought together at these interfaces 176, 178 (e.g., horizontal aspects of layers 136, 150 and 152 abut layer 164), there may be weaker bonds at the interfaces, which may provide a less restrictive path for electrons and/or atoms and ions. As such, electrons and/or ions that may be "encouraged" to move or conduct from the conductive bottom electrode layer 136 to the conductive top electrode layer 152 (and/or vice versa) when a voltage or bias is applied to or experienced by the capacitor 100 will have an easier time "skirting" along the interfaces, as compared to passing through the nonconductive dielectric layer 150. However, this outcome is virtually eliminated by removing the sidewall aspects 148 of the conductive layer of the bottom electrode/copper diffusion barrier material 136 in accordance with one or more aspects of the present invention.

Additionally, the edges of some of the layers of material at the interfaces, such as layers 136, 150 and 152, for example, or atoms of other conductive materials such as copper may become somewhat "smeared" together during the CMP process where atoms of one layer are transported closer to other layers along the interfaces 176, 178. As such, conductive layers 136 and 152 or atoms comprising said layers may be moved closer together and/or some of dielectric layer 150 may be removed during CMP processing, for example. This would make it even easier for electrons, atoms, and/or ions to move along the interfaces 176, 178 and short out the capacitor. However, this undesirable situation is mitigated as well since sidewall aspects 148 of the bottom electrode layer 136 are removed when forming a capacitor in accordance with one or more aspects of the present invention. Thus, there is little to no opportunity for shorting currents to arise along interfaces 176 and 178. Further, the amount of bottom electrode layer 136 remaining is sufficient to serve as an effective barrier against copper diffusion from metal 110.

Thus, forming a capacitor 100 in accordance with one or more aspects of the present invention mitigates shorting pathways by removing sidewall aspects 148 of the bottom electrode 136 while not exposing underlying copper 110. This avoids yield and performance loss while mitigating dependence on CMP performance and interface defectivity across a wafer 102. More particularly, by removing the sidewall portion 148 of the bottom electrode layer 136, a more repeatable across wafer capacitance is achievable from the manufacturing process because CMP variations across the wafer 102 will not affect the total capacitance since the sidewall component of the capacitor is not contributing to the capacitance. Further, the copper diffusion barrier 136 remaining at the bottom electrode and the diffusion barrier 152 at the top electrode mitigate Cu diffusion through the dielectric 150 allowing the product to perform to lifetime and reliability requirements.

Figure 8:
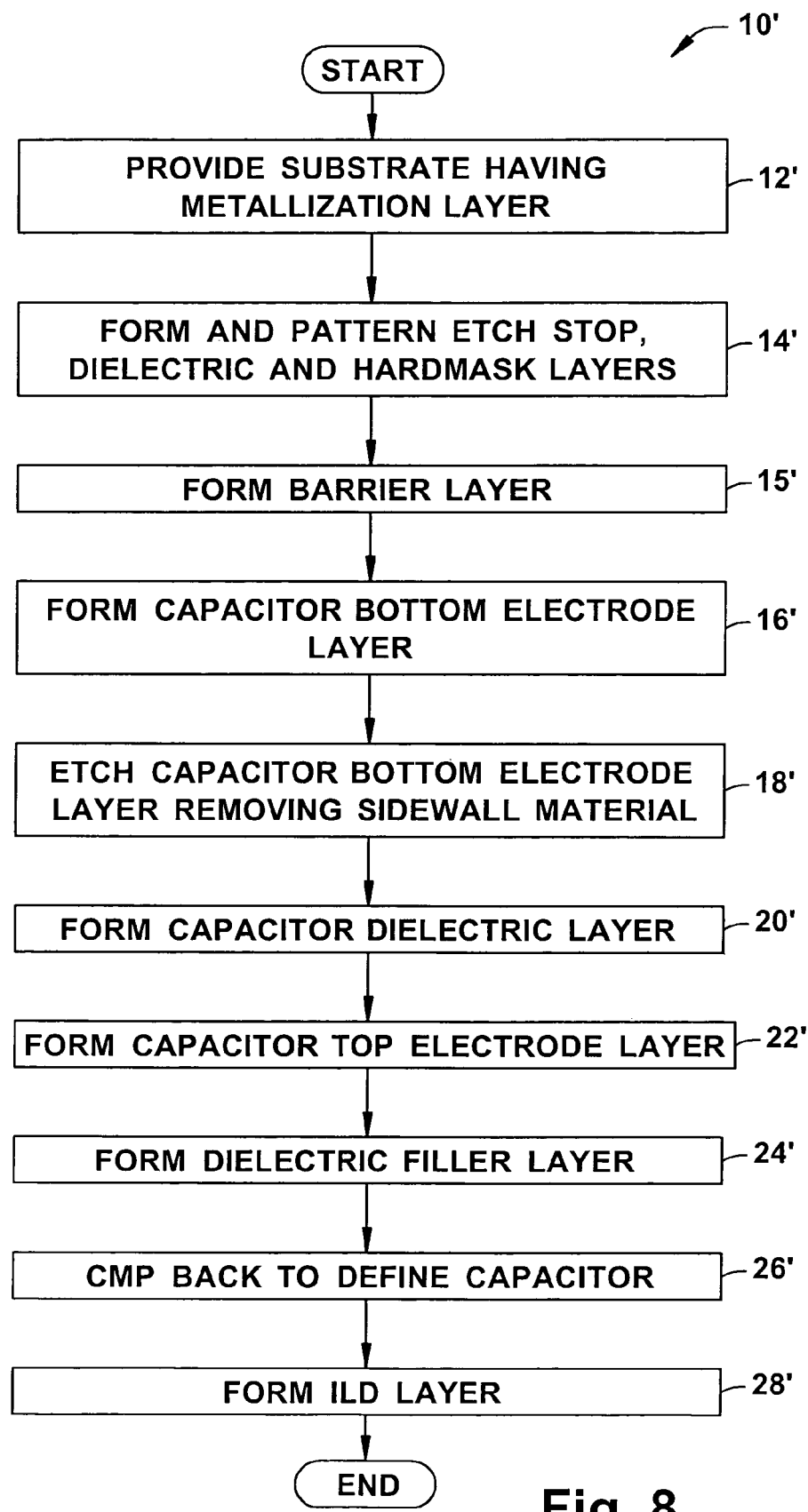
FIG. 8 is a flow diagram illustrating another exemplary methodology for forming a MIM capacitor in accordance with one or more aspects of the present invention.

Turning to FIG. 8, another exemplary methodology 10' is illustrated for forming a MIM (metal insulator metal) capacitor according to one or more aspects of the present invention. Most of the acts of methodology 10' are similar to those of methodology 10 and thus are addressed with the same reference characters, but having a prime "'" notation. Similarly, the corresponding cross sectional Figs. are similar to those referred to with regard to methodology 10 and thus are also labeled with the same reference characters, but also having a prime "'" notation. For purposes of brevity where the same features, elements, acts, etc. of methodology 10 are reproduced in methodology 10' and the accompanying Figs., they are not elaborated upon.

Figure 9:
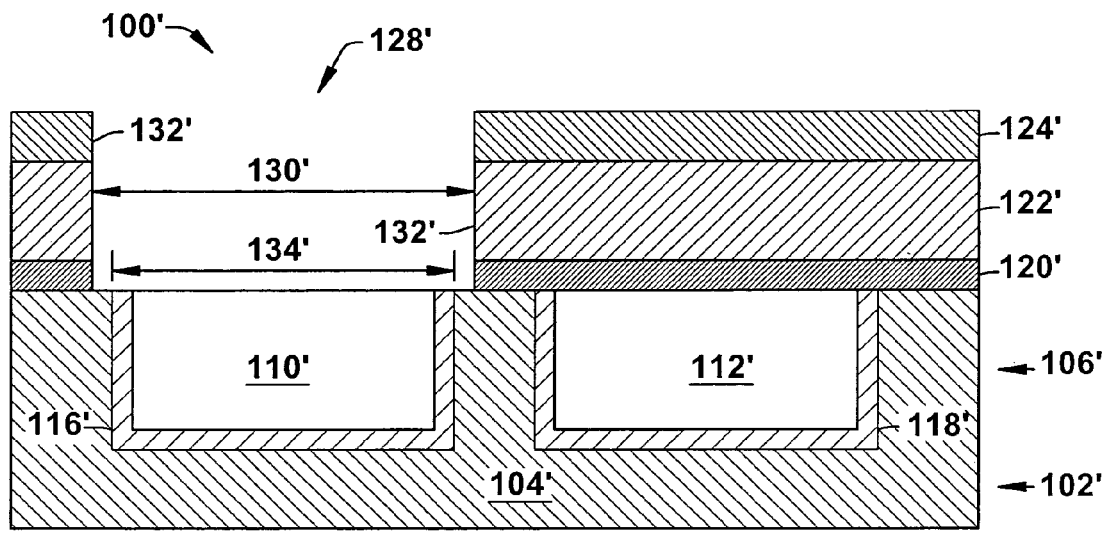
FIGS. 9–16 are cross-sectional illustrations of a MIM capacitor formed according to one or more aspects of the present invention, such as that set forth in FIG. 8.
Figure 10:
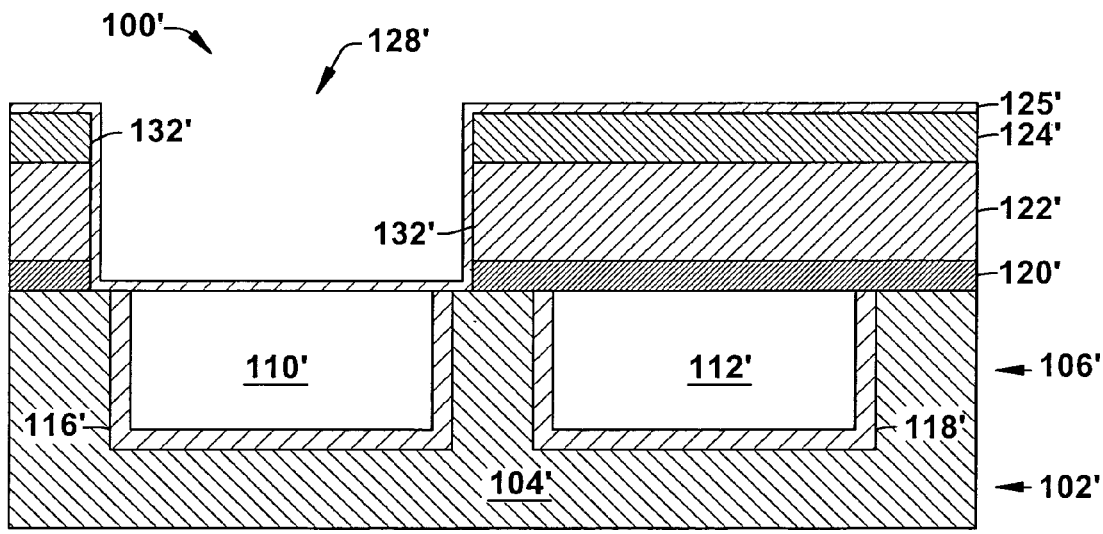

Initially, a substrate 102' is provided that has been processed through formation of a metallization layer 106' at 12' (FIG. 9). A layer of an etch stop material 120', a layer of a dielectric material 122' and an optional layer of hardmask material 124' are sequentially formed over the substrate 102' and then etched at 14' (FIG. 9). A relatively thin (e.g., on the order of about 15 nanometers or less) layer of barrier material 125' is then formed over layer 124' and down into aperture 128' and over metal 110' at 15' (FIG. 10). This layer has a substantially uniform thickness and as such is preferably formed via a conformal process, such as chemical vapor deposition (CVD) or atomic layer deposition (ALD), for example. As will be appreciated, layer 125' serves as a substantially effective copper diffusion barrier.

Figure 11:
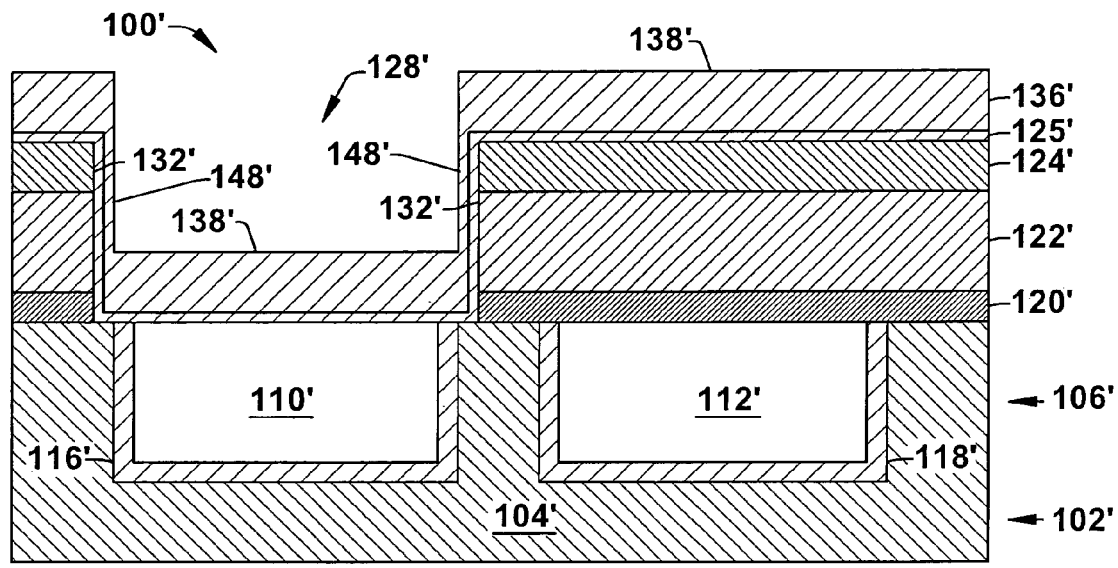
Figure 12:
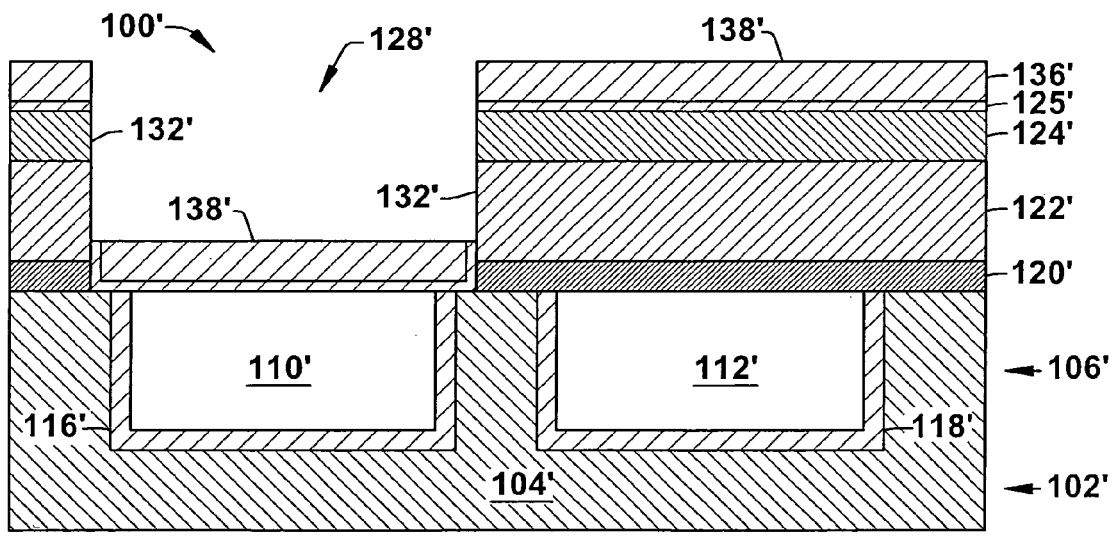
Figure 13:
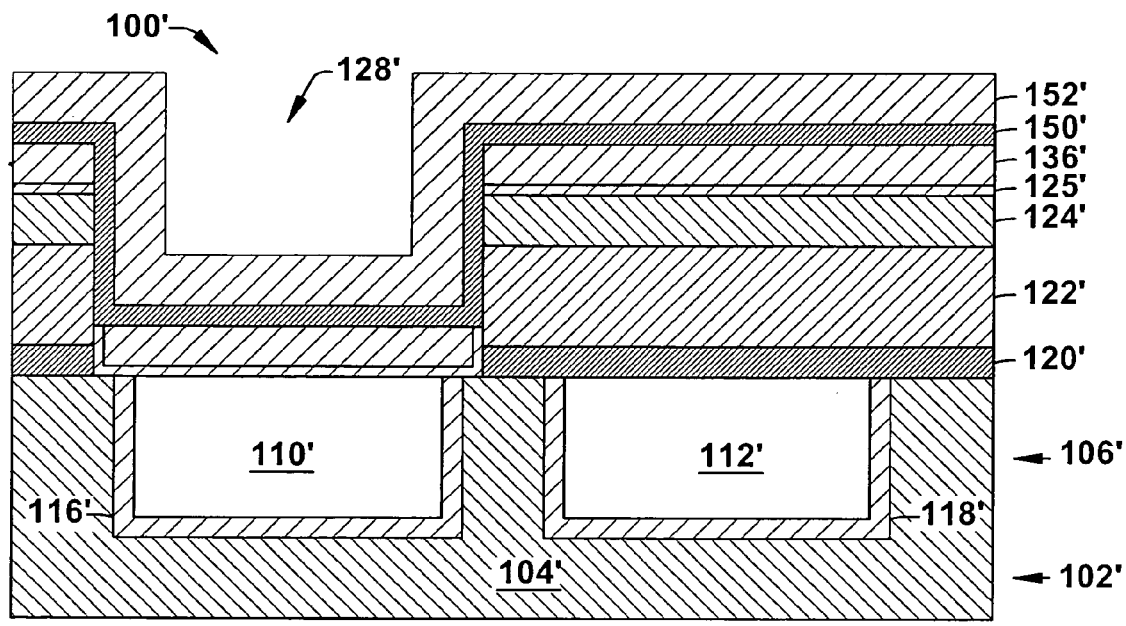
Figure 14:
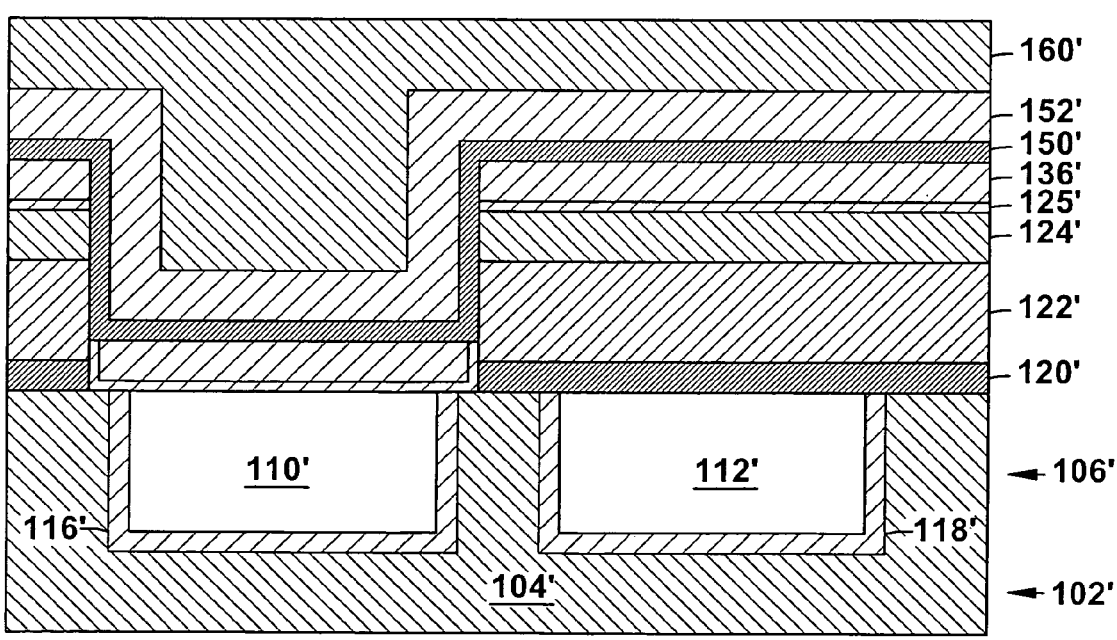
Figure 15:
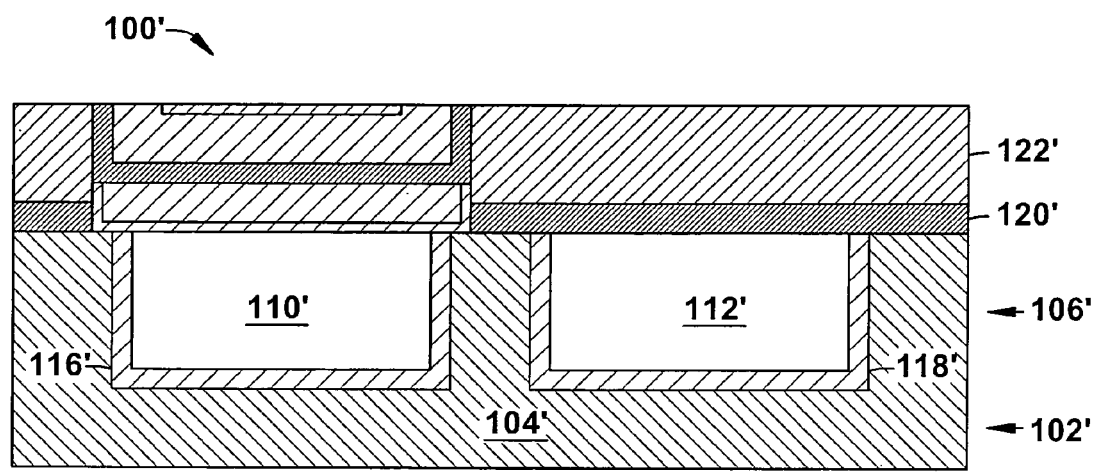
Figure 16:
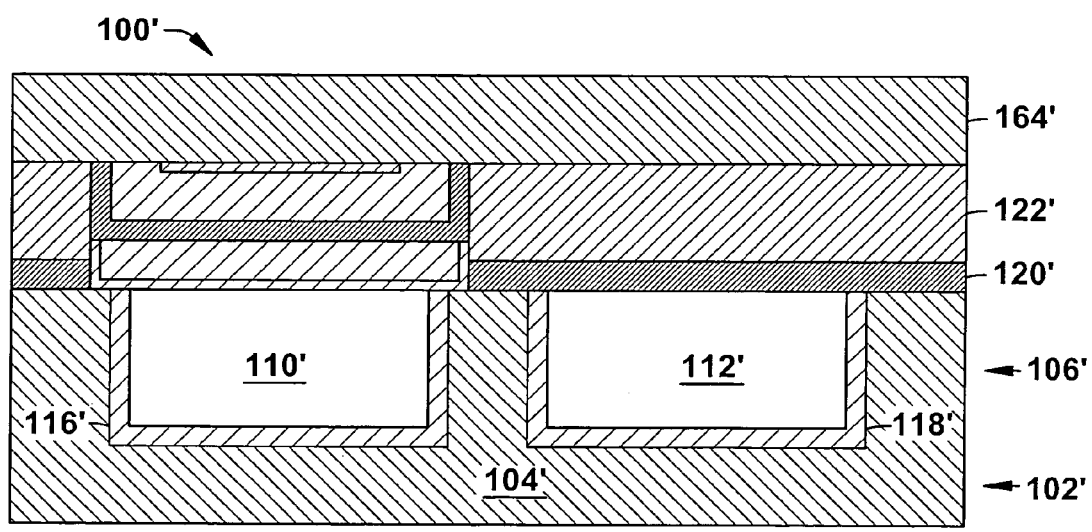

A layer of bottom electrode material 136' is then anisotropically formed (e.g., via PVD) over the layer of barrier material 125' at 16' (FIG. 11). The layer of bottom electrode material 136' is then etched at 18' to remove sidewall material. Since the layer of bottom electrode material 136' is anisotropically formed, the etching quickly removes thinner sidewall aspects of layer 136', and thus readily proceeds to remove sidewall aspects of barrier layer 125' (FIG. 12). However, horizontal aspects of barrier layer 125' are protected by the thicker horizontal aspects of layer 136' and thus remain substantially unaffected. A capacitor dielectric layer 150' and a capacitor top electrode layer 152' are sequentially formed over layer 136' and down into aperture 128' at 20' and 22', respectively (FIG. 13). At 24', a layer of dielectric filler material 160' is formed over the top electrode layer 152' and fills in the aperture 128' (FIG. 14). Although not illustrated, it will be appreciated that a layer of etch stop material can be formed prior to forming the layer of filler material 160', and the layer of filler material 160' can then be formed over the etch stop layer. A CMP process is then performed to define the capacitor 100 at 26' (FIG. 15). An additional layer of ILD material 164' is then formed over the capacitor 100' and the remaining capacitor ILD material 122' (FIG. 16).

It will be appreciated that barrier layer 125' is formed conformally or isotropically, while layer 136' is formed anisotropically because an isotropically deposited copper barrier may be as or more effective at blocking the diffusion of copper than a barrier deposited via a more anisotropic methodology such as PVD (physical vapor deposition). In one example, layers 125' and 136' can be formed from the same or similar materials. For example, barrier layer 125' can be formed of a thin CVD TiN (preferably in combination with a silane-soak process to form TiNSi—) layer or ALD TaN, while layer 136' can be formed of a thicker PVD TiN or TaN layer, for example. In the example of TiN, the thinner CVD layer acts as the high quality Cu diffusion layer while the thicker PVD TiN deposition can be tuned specifically to achieve the desired anisotropic deposition profile with less regard to Cu barrier properties since the Cu barrier properties of the PVD layer are less important given that the CVD layer is underneath. One or more aspects of the present invention thus allow the respective depositions of layers 125' and 136' to be tuned for their respective purposes.

Then a wet etch chemistry of ammonia hydroxide/hydrogen peroxide, for example, (which happen to be relatively common wet etch chemistries employed in semiconductor processing) can be used to remove the TiN/TiSiN sidewall barrier, in this example. Since the two layers can be similar in chemistry, the wet etch rates of both layers 136' and 125' can be similar. This gives more control over the etching process and mitigates the need to switch etch chemistries during the process, thus reducing cost and increasing throughput. It will be appreciated, however, that a variety of barrier materials and etch chemistries (both wet and dry) can be employed in such a bi-layer scheme. Further, CVD and PVD deposition capability is ubiquitous in most semiconductor fabrication processes. Therefore, a high level of development is not necessary to implement one or more aspects of the present invention.

It will be appreciated that while reference is made throughout this document to exemplary structures in discussing aspects of methodologies described herein (e.g., those structures presented in FIGS. 2–7 while discussing the methodology set forth in FIG. 1, and those structures presented in FIGS. 9–16 while discussing the methodology set forth in FIG. 8), that those methodologies are not to be limited by the corresponding structures presented. Rather, the methodologies (and structures) are to be considered independent of one another and able to stand alone and be practiced without regard to any of the particular aspects depicted in the referenced figures.

It will also be appreciated that copper diffusion barriers, including all such layers disclosed herein, are typically formed using conductive compounds of transition metals, such as tantalum, tungsten and titanium alone or in combination with their respective nitrides, carbonitrides, silicon nitrides and/or silicon carbonitrides (e.g., tantalum nitride, tantalum silicon nitride, titanium nitride, titanium silicon nitride, tungsten nitride, tungsten silicon nitride, tungsten carbonitride). It will be appreciated, however, that any and all barrier materials with sufficient Cu barrier properties are contemplated as falling within the scope of the present invention. Likewise, chemistries employed to remove the sidewall barrier can be chosen specifically to be optimized around removing the barrier of choice. For example, an HF-based wet etch chemistry can be used to remove Ta based barrier layers, or an ammonium hydroxide/hydrogen peroxide system can be used to remove TiN. As such, any and all copper barriers and sidewall barrier removal chemistries are contemplated as falling within the scope of the present invention.

Further, from time to time throughout this specification and the claims that follow, one or more layers or structures may be described as being or containing a substance such as "tungsten", "copper", "silicon nitride", etc. These descriptions are to be understood in context and as they are used in the semiconductor manufacturing industry. For example, in the semiconductor industry, when a metallization layer is described as containing copper, it is understood that the metal of the layer comprises pure copper as a principle component, but the pure copper may be, and typically is, alloyed, doped, or otherwise impure. As another example, silicon nitride may be a silicon rich silicon nitride or an oxygen rich silicon nitride. Silicon nitride may contain some oxygen, but not so much that the material's basic properties are substantially different from that of high purity stoichiometric silicon nitride.

Although one or more aspects of the invention have been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), thermal growth techniques and/or deposition techniques such as chemical vapor deposition (CVD), physical vapor deposition (PVD) and/or plasma enhanced chemical vapor deposition (PECVD), or atomic layer deposition (ALD), for example.

What is claimed is:

1. A method of forming a MIM (metal insulator metal) capacitor, comprising:
    forming a layer of bottom electrode material down into an aperture where the capacitor is to be defined, wherein a horizontal aspect of the layer is formed over a metal on a substrate along the entirety of a bottom of the aperture and a sidewall aspect of the layer is formed along sidewalls of the aperture;
    completely removing the sidewall aspect of the layer of bottom electrode material, but not reducing in width the horizontal aspect of the layer of the bottom electrode material in the bottom of the aperture;
    forming in a conformal manner a layer of capacitor dielectric material into the aperture over the horizontal aspect of the layer of bottom electrode material and along the sidewalls of the aperture; and
    forming in a conformal manner a layer of top electrode material over the layer of capacitor dielectric material.

2. The method of claim 1, wherein the horizontal aspect of the layer of bottom electrode material is formed to a first thickness and the sidewall aspect of the layer of bottom electrode material is formed to a second thickness, wherein the first thickness is substantially greater than the second thickness.

3. The method of claim 2, wherein the layer of bottom electrode material is formed via a directional process.

4. The method of claim 3, wherein the layer of bottom electrode material is formed via physical vapor deposition (PVD).

5. The method of claim 2, wherein the sidewall aspect of the layer of bottom electrode material is removed via isotropic etching, without implementing lithographic techniques.

6. The method of claim 5, wherein the layer of bottom electrode material comprises at least one of tantalum, tungsten, titanium, tantalum nitride, tantalum silicon nitride, titanium nitride, tungsten nitride, titanium silicon nitride, tungsten silicon nitride and tungsten carbonitride.

7. The method of claim 6, wherein the sidewall aspect of the layer of bottom electrode material is removed with an etchant comprising at least one of an HF-based chemistry, ammonium hydroxide and hydrogen peroxide.

8. The method of claim 2, wherein the first thickness is between about 8 to about 60 nanometers and the second thickness is less than about 4 nanometers.

9. The method of claim 1, wherein the layer of capacitor dielectric material comprises at least one of oxide based materials, nitride based materials, carbide based materials, silicon based materials, oxynitride based materials, silicon oxide based materials, spin-on dielectrics, organic materials, and quasi-organic materials.

10. The method of claim 1, wherein the layer of capacitor dielectric material is formed via plasma enhanced chemical vapor deposition (PECVD).

11. The method of claim 1, wherein the layer of capacitor dielectric material is formed to a thickness of less than about 70 nanometers.

12. The method of claim 1, wherein the layer of top electrode material is formed to a thickness of between about 5 to about 50 nanometers.

13. The method of claim 1, wherein the layer of top electrode material comprises at least one of tantalum, tungsten, titanium, tantalum nitride, tantalum silicon nitride, titanium nitride, titanium silicon nitride, tungsten nitride, tungsten silicon nitride and tungsten carbonitride.

14. The method of claim 1, further comprising:
    forming a layer of etch stop material over the layer of top electrode material;
    forming a layer of inter layer dielectric material over the layer of etch stop material and filling in the aperture; and
    removing excess inter layer dielectric material, etch stop material, top electrode material and capacitor dielectric material to define the capacitor.

15. The method of claim 14, wherein removing excess inter layer dielectric material, etch stop material, top electrode material and capacitor dielectric material is accomplished via chemical mechanical polishing (CMP).

16. The method of claim 1, wherein the aperture is formed within a layer of an etch stop material formed over the substrate and a layer of a dielectric material formed over the layer of etch stop material.

17. The method of claim 1, wherein the metal at the bottom of the aperture comprises at least one of copper and a copper alloy.

18. The method of claim 2, further comprising:
forming a layer of barrier material down into the aperture before forming the layer of bottom electrode material, the layer of barrier material having a substantially uniform thickness;
forming the layer of bottom electrode material over the layer of barrier material; and
removing a sidewall aspect of the layer of barrier material when the sidewall aspect of the layer of bottom electrode material is removed.

19. The method of claim 18, wherein the layer of barrier material is formed via at least one of conformal and isotropic processes.

20. The method of claim 19, wherein the layer of barrier material is formed to a thickness of about 15 nanometers or less and comprises at least one of tantalum, tungsten, titanium, tantalum nitride, tantalum silicon nitride, titanium nitride, titanium silicon nitride, tungsten nitride, tungsten silicon nitride and tungsten carbonitride.

* * * * *